(12) United States Patent
de Souza et al.

(10) Patent No.: US 10,002,929 B2
(45) Date of Patent: *Jun. 19, 2018

(54) REDUCTION OF DEFECT INDUCED LEAKAGE IN III-V SEMICONDUCTOR DEVICES

(71) Applicant: INTERNATIONAL BUSINESS MACHINES CORPORATION, Armonk, NY (US)

(72) Inventors: Joel P. de Souza, Putnam Valley, NY (US); Jeehwan Kim, Los Angeles, CA (US); Devendra K. Sadana, Pleasantville, NY (US); Brent A. Wacaser, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/395,718

(22) Filed: Dec. 30, 2016

(65) Prior Publication Data

US 2017/0110546 A1 Apr. 20, 2017

Related U.S. Application Data

(63) Continuation of application No. 14/709,044, filed on May 11, 2015, now Pat. No. 9,401,397, and a (Continued)

(51) Int. Cl.
*H01L 33/00* (2010.01)
*H01L 29/267* (2006.01)
(Continued)

(52) U.S. Cl.
CPC ........ *H01L 29/267* (2013.01); *H01L 29/0607* (2013.01); *H01L 29/263* (2013.01);
(Continued)

(58) Field of Classification Search
CPC ............. H01L 21/02505; H01L 31/073; H01L 31/1828; H01L 33/0087
See application file for complete search history.

(56) References Cited

U.S. PATENT DOCUMENTS 5,874,747 A 2/1999 Redwing et al.
7,153,713 B2 12/2006 Lai et al.
(Continued)

OTHER PUBLICATIONS

List of IBM Patents or Patent Applications Treated as Related dated Dec. 29, 2016. (2 Pages).

(Continued)

*Primary Examiner* — Thomas L Dickey
(74) *Attorney, Agent, or Firm* — Tutunjian & Bitetto, P.C.; Louis J. Percello

(57) ABSTRACT

A semiconductor device includes a semiconductor substrate and a p-doped layer formed on the substrate having a dislocation density exceeding $10^8$ cm$^{-2}$. An n-type layer is formed on or in the p-doped layer. The n-type layer includes a II-VI material configured to tolerate the dislocation density to form an electronic device with reduced leakage current over a device with a III-V n-type layer.

17 Claims, 5 Drawing Sheets

Related U.S. Application Data continuation of application No. 14/745,146, filed on Jun. 19, 2015, now Pat. No. 9,583,562, which is a continuation of application No. 14/709,044, filed on May 11, 2015, now Pat. No. 9,401,397.

(51) Int. Cl.
- *H01L 29/06* (2006.01)
- *H01L 29/26* (2006.01)
- *H01L 29/22* (2006.01)
- *H01L 29/227* (2006.01)
- *H01L 29/20* (2006.01)
- *H01L 29/08* (2006.01)
- *H01L 29/861* (2006.01)

(52) U.S. Cl.
CPC .......... *H01L 29/0843* (2013.01); *H01L 29/20* (2013.01); *H01L 29/2206* (2013.01); *H01L 29/227* (2013.01); *H01L 29/8613* (2013.01)

(56) References Cited

U.S. PATENT DOCUMENTS

| | | | |
|---|---|---|---|
| 7,659,557 | B2 | 2/2010 | Tsai et al. |
| 8,946,727 | B2 | 2/2015 | Nakahara et al. |
| 8,952,400 | B2 | 2/2015 | Jung et al. |
| 9,401,397 | B1* | 7/2016 | de Souza ................ H01L 29/78 |
| 9,583,562 | B2* | 2/2017 | de Souza ................ H01L 29/78 |
| 2004/0201030 | A1 | 10/2004 | Kryliouk et al. |
| 2013/0075740 | A1 | 3/2013 | Correia Fortunato et al. |
| 2013/0277699 | A1* | 10/2013 | Liao ......................... F21K 9/50 257/98 |
| 2014/0367640 | A1* | 12/2014 | Fujii ...................... H01L 33/30 257/13 |
| 2015/0001469 | A1 | 1/2015 | Cheng et al. |
| 2015/0034900 | A1 | 2/2015 | Aihara |

OTHER PUBLICATIONS

List of IBM Patents or Patent Applications Treated as Related dated Feb. 21, 2017 (2 Pages).

\* cited by examiner

REDUCTION OF DEFECT INDUCED LEAKAGE IN III-V SEMICONDUCTOR DEVICES

BACKGROUND

Technical Field

The present invention relates to semiconductor devices and processes, and more particularly to semiconductor devices that employ doped ZnO for n+ layers to reduce defect-induced leakage.

Description of the Related Art

Metal oxide field effect transistors (MOSFETs), which employ materials, such as GaAs. InP or InGaAs substrates, often include doped source and drain regions made of a similar material. In one common structure, III-V MOSFETs include source drain (S/D) regions formed from doped InGaAs (e.g., n+ InGaAs). n+ InGaAs is not ideal for S/D regions. In InGaAs nFETs, the n+ InGaAs S/D regions suffer from a low doping concentration (e.g., $1\times10^{19}$ cm$^{-3}$). In addition, there is relatively high junction leakage and high contact resistance in InGaAs S/D regions. The junction leakage can be attributed at least in part to high dislocation density (e.g., about (e.g., greater than $1\times10^9$ cm$^{-2}$) as a result of lattice mismatch between InGaAs and Si. In such instances, the dislocations become electrically active becoming a leakage source. To attempt to reduce dislocation density, a Ge buffer layer has been employed which reduces lattice mismatch from about 8% with Si to about 4% with Ge. However, dislocation density remains high greater than $5\times10^8$ cm$^{-2}$).

SUMMARY

A semiconductor device includes a semiconductor substrate and a p-doped layer formed on the substrate having a dislocation density exceeding $10^8$ cm$^{-2}$. An n-type layer is formed on or in the p-doped layer. The n-type layer includes a II-VI material configured to tolerate the dislocation density to form an electronic device with reduced leakage current over a device with n-type layer.

Another semiconductor device includes a Si semiconductor substrate and a buffer formed on the substrate. An InGaAs p-doped layer is formed on the buffer. A ZnO n-type layer is formed on or in the p-doped layer. The n-type layer is configured to tolerate dislocation density to form an electronic device with reduced leakage current over a device with a III-V n-type layer.

A method for forming a semiconductor device includes providing a p-doped layer including a doped III-V material on a Si substrate wherein lattice mismatch between the III-V material and the Si substrate provides a dislocation density exceeding $10^8$ cm$^{-2}$; and reducing leakage current in the device by forming an n-type layer including, ZnO on or in the p-doped layer such that the device can tolerate the dislocation density to form an electronic device where the leakage current is less than that of a device with a III-V n-type layer.

These and other features and advantages will become apparent from the following detailed description of illustrative embodiments thereof, which is to be read connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
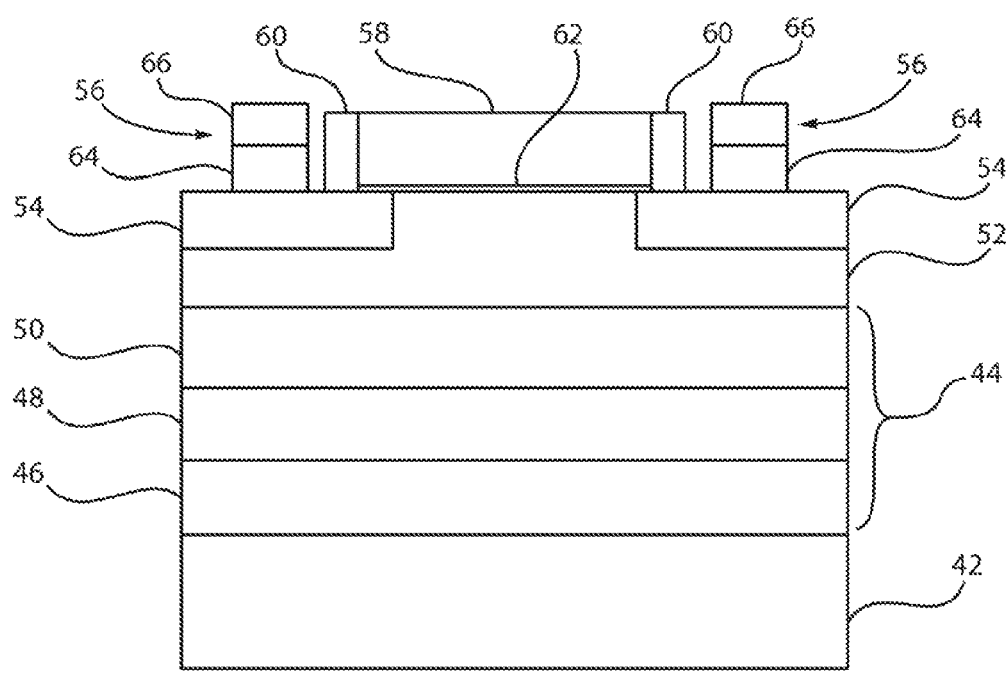
FIG. 1 is a cross-sectional view of a partially fabricated field effect transistor with a ZnO n-type layer forming source and drain regions in accordance with the present principles.

In accordance with the present principles, electronic devices, structures and methods for formation are described for replacing n-doped semiconductor materials with a II-VI material, such as, e.g., doped ZnO. Doped ZnO, and in particular, n$^+$ Al-doped ZnO (ZnO:Al or AZO) provides a replacement material for source and drain (S/D) regions or active layers in diodes, etc. ZnO:Al has a similar electron affinity (~4.35-~44 eV) as n+ InGaAs, which is ~4.5 eV, ZnO:Al has a greater doping level that can be obtained, for example, up to about $5\times10^{21}$ cm$^{-3}$.

In accordance with the present principles, material selection and substitution is employed to counter the dislocation density (the number of interfacial defects between layers). In accordance with particularly useful embodiments, AZO is placed on InGaAs or similar III-V materials to reduce leakage current due to defects in complementary metal oxide semiconductor (CMOS) processing. CMOS processing is a mature fabrication technique that is based on the use of Si wafers/substrates. The use of III-V materials for higher performance is also advantageous in CMOS applications. However, there are lattice mismatches between Si and III-V materials. The lattice mismatches lead to dislocation defects, which in turn lead to leakage current due to the electronic activity of the defects during device operation.

The present principles provide an n-type II-VI material (to substitute for an n-type III-V material) that tolerates high dislocation density. Devices in accordance with the present principles provide device performance enhancements despite high lattice mismatches or dislocation density defects. For example, in some embodiments, a reduction in leakage current of more than two orders of magnitude can be achieved over conventional structures for n-type InGaAs layers.

In addition, ZnO:Al processing is more compatible with metallization processing. For example, S/D regions may include metal layers formed thereon. ZnO:Al is more compatible with the metal material employed in forming these structures, e.g., contacts.

The formation of ZnO:Al also tends to be easier. For example, instead of epitaxial growth processes with patterned doping (e.g., for n+ InGaAs), ZnO:Al may be formed using atomic layer deposition (ALD), although other processes may be employed. This permits a doped layer with less surface damage. Materials like Al may be formed directly on the ZnO and be annealed to cause diffusion of the Al to dope the ZnO.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be an product that includes integrated circuit chips, ranging from toys and other low-end applications to advanced computer products having a display, a keyboard or other input device, and a central processor.

It should also be understood that material compounds will be described in terms of listed elements, e.g., InP, InGaAs or ZnO. These compounds may include different proportions of the elements within the compound, e.g., InGaAs includes $In_xGa_{1-x}As$, where x is less than or equal to 1, or ZnO includes $Zn_xO_{1-x}$, where x is less than or equal to 1, etc. In addition, other elements may be included in the compound, such as, e.g., ZnO:Al, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-section of a metal oxide field effect transistor (MOSFET) 40 is shown in accordance with one illustrative example. The FET 40 includes a wafer or substrate 42, an optional buffer stack (or layer) 44, a p-doped layer 52 and n-type source and drain (S/D) regions 54. While the structure described and shown in accordance with the present principles is particularly useful for n-type FETs, doping changes and materials may be adjusted to implement the present principles in p-type FETs as well. In one embodiment, the wafer 42 includes Si. Si is employed extensively in MOSFET devices and CMOS processing. The buffer stack 44 may include one or more buffer layers 46, 48, 50 configured to reduce dislocations by lattice matching. In one embodiment, the p-doped layer 52 includes a III-V layer, such as, e.g., InGaAs. To reduce dislocations, the buffer stack 44 may include Ge, GaAs and InP to reduce dislocations. For example, buffer layer 46 may include Ge, buffer layer 48 may include a III-V material, such as GaAs and buffer layer 50 may include material such as InP. Other materials may also be employed for the buffer layers. In a particularly useful embodiment, the p-doped layer 48 may include a p-doped InGaAs layer and in particular $In_{0.53}Ga_{0.47}As$, although other III-V materials may be employed.

In accordance with useful embodiments, a II-VI material may be employed for the S/D regions 54. In particular, ZnO or indium tin oxide (ITO) may be employed. The ZnO preferably includes n+ ZnO:Al deposited by any suitable process, chemical vapor deposition (CVD), physical vapor deposition (PVD), atomic layer deposition (ALD), although other formation processes may be employed, e.g., metalorganic CVD (MOCVD), epitaxy, etc. The formation process forms the S/D regions 54 by selective growth or by patterning (e.g., lithographic patterning). In one embodiment, the p-doped layer 52 is etched and the n-type material for S/D regions 54 is epitaxially grown.

Conventional structures implement a III-V material (e.g., for the p-doped layer and n-type S/D regions); however, using III-V material on a Si substrate leads to high dislocation density. While the use of a buffer layer or stack provides a reduction in dislocation density, the dislocation density and therefore the leakage current remains high.

In accordance with the present principles, to further reduce leakage current due to dislocation defects, a II-VI material is employed for the S/D regions 54. In other embodiments, CMOS processing with Si may w be employed with III-V materials without sacrificing performance due to dislocation defects.

Now, in accordance with the present principles, a Si substrate may be employed with InGaAs materials despite an 8% lattice mismatch by employing AZO n-type layers for S/D regions 54 (for FETs). The AZO layer or equivalent material reduces the leakage current due to dislocation defects enough to permit improved performance despite the mismatch. This permits the use of Si substrates with III-V active layers while eliminating many of the drawbacks of lattice mismatches. In accordance with useful embodiments, an n-type material, such as, ZnO or its alloys may be employed for the II-VI material for the S/D regions 54.

A range of n-doping in ZnO is up to 2 atomic percent (e.g., ~$5\times10^{21}$/cm$^3$). ZnO dopants may include Al, B, Ga, In, etc, with Al:ZnO being preferred. ZnO may be deposited or grown by one or more of the following processes, epitaxy, sputtering, atomic layer deposition (ALD), metal organic chemical vapor deposition (MOCVD), etc. The carrier concentration (electron density) of the S/D regions 54 may be between about $1\times10^{21}$ cm$^{-3}$ to about $5\times10^{21}$ cm$^{-3}$, and preferably about $3.0\times10^{21}$ cm$^{-3}$ for doped Aluminum Zinc Oxide (ZnO:Al) (AZO).

The n-type material for S/D regions 54 (e.g., ZnO:Al) is preferably crystalline in form. This includes a monocrystalline structure and may include a multi-crystal structure or other crystalline structure (micro, nano, etc.). However, the AZO material of S/D regions 54 may also include amorphous phases. In one embodiment, the ZnO of S/D regions 54 is amorphous. The underlying layers, e.g., p-doped layer 52 and layers 46, 48 and 50 are also preferably crystalline, but may include other phases.

The PET 40 is further processed by forming a gate dielectric 62, e.g., HfO$_2$, Al$_2$O$_3$, or other high dielectric constant material, and/or insulating layers. A gate electrode 58 is then formed along with dielectric spacers 60. The gate electrode 58 may include any suitable highly conductive material, e.g., Cu, Cr, Au, Ag, etc. Contacts 56 are also formed on the SSD regions 54 through a dielectric material (not shown). The contacts 56 may include a wider range of materials over conventional devices, that is, more compatible materials are available for use as contact metals. For example, the FET 40 may include metal contacts 56 in bi-layers 64, 66 of e.g., Al and Au. An Al liner may be placed on the S/D regions 54 followed by a highly conductive material such as Au or Pt. Other metals or combinations of metals are also contemplated. The Al (or other metal layer) may be employed as a dopant source for doping or further doping the underlying S/D regions 54. An anneal process may be performed to assist in doping the SD regions 54 with contact metals.

Figure 2:
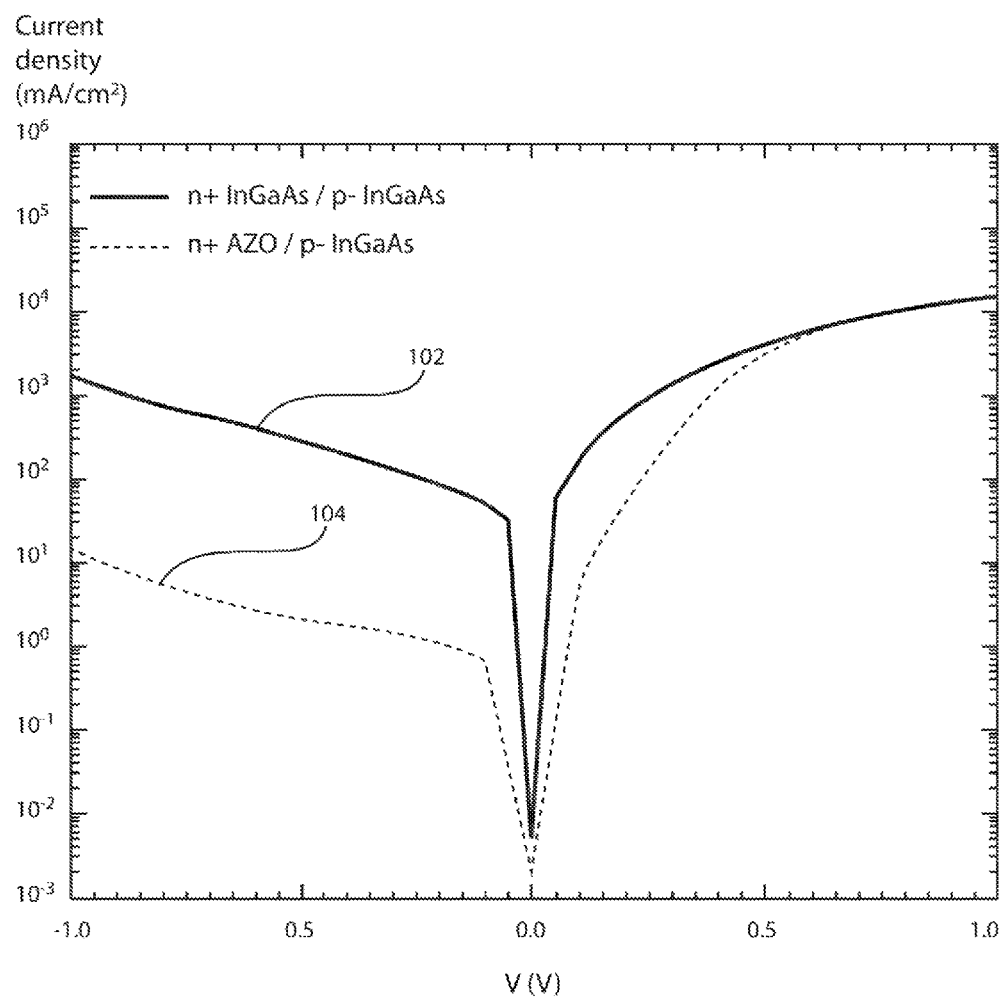
FIG. 2 is a graph of absolute value of current density (mA/cm$^2$) versus voltage (V) for a diode of that includes an n-type layer of n+ InGaAs and a diode that includes an n-type layer of n+ ZnO:Al in accordance with the present principles.

Referring to FIG. 2, a current density (mA/cm$^2$) versus voltage (V) graph plots absolute value of device current density versus device voltage for two diode devices. The graph is provided to demonstrate leakage current due to dislocation defects. One plot 102 corresponds to a device that includes n+ InGaAs (specifically In$_{0.53}$Ga$_{0.47}$As) used for the n-doped layer in accordance with a conventional diode. The conventional diode includes a structure having a p– InGaAs layer and an n+ InGaAs layer formed on the p– GaAs layer.

Another plot 104 corresponds to a device that includes n+ ZnO:Al in accordance with the present principles. The n+ ZnO:Al replaces n+ InGaAs in this example.

Both diodes included a dislocation density of greater than $5\times10^8$ cm$^{-2}$ in the p– InGaAs. As seen in the graph, plot 104 for n+ ZnO:Al provides a reduced leakage current than the plot 102 for n+ InGaAs for negative voltages. At –1.0 volt, at least two orders of magnitude reduction in leakage current was achieved by employing n+ ZnO:Al instead of n+ InGaAs.

Plot 104 provides an on/off ratio of at least $1\times10^3$. This is comparable to similar devices with no lattice mismatch, e.g., very low dislocation defect density (e.g., InGaAs on InP). Plot 102 provides only an on/off ratio of about 10. The on/off ratio of the device of plot 104 is improved by 2-3 orders of magnitude over that of the device for plot 102. The on/off ratio provides an indication of leakage current and may be defined as the current at 1 V divided by the current at –1 V.

Figure 3:
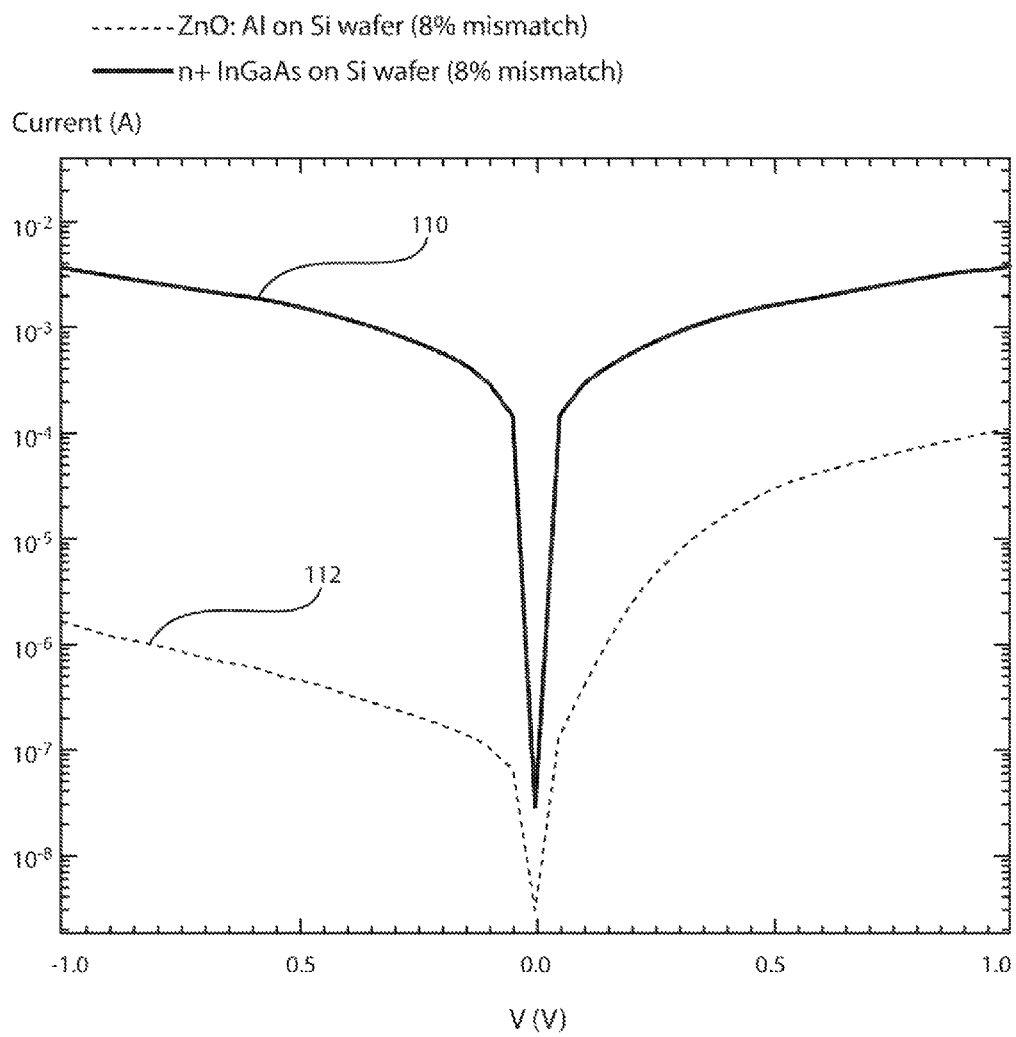
FIG. 3 is a graph of absolute value of current (A) versus voltage (V) for a diode that includes an n-type layer of n+ InGaAs on a silicon wafer and a diode that includes an n-type layer of n+ ZnO:Al on a silicon wafer in accordance with the present principles.

Referring to FIG. 3, an absolute value of current (A) versus voltage (V) graph (I-V graph) is plotted for two diode devices. A first plot 110 shows I-V data for a diode having an n-type layer that includes n+ InGaAs on a p-type layer (p– InGaAs) on a Si wafer. A second plot 112 shows I-V data for a diode having an n-type layer that includes n+ ZnO:Al on a p-type layer (p– InGaAs) on a Si wafer. Both diodes include an 8% mismatch (between InGaAs and Si, corresponding to a dislocation density of greater than $1\times10^9$ cm$^{-2}$). At 8% mismatch, the InGaAs only diode (plot 110) shows poor diodic characteristics (e.g., higher resistance). The diode including n+ ZnO:Al still functions as an excellent diode performance.

In accordance with the present principles, leakage arising from high density dislocation density in III-V films on Si can be substantially reduced if a II-VI material such as ZnO is employed in n+ layers.

Figure 4:
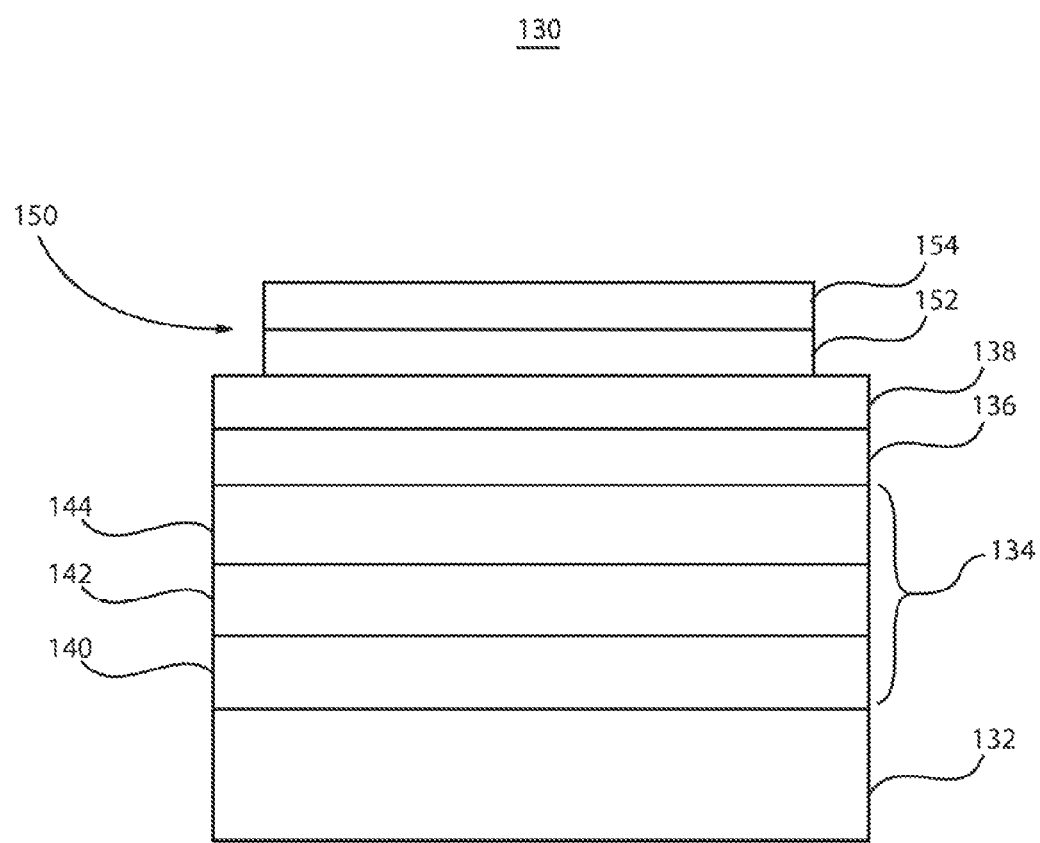
FIG. 4 is a cross-sectional view of a partially fabricated diode with a ZnO n-type layer forming a junction in accordance with the present principles.

Referring to FIG. 4, a cross-section of a diode 130 is shown in accordance with one illustrative example. The diode 130 includes a wafer or substrate 132 and an optional buffer layer or stack 134, a p-doped layer 136 and an n-type layer 138. While the structure described and shown in accordance with the present principles is particularly useful for n-type diodes, doping changes and materials may be adjusted to implement the present principles in p-type devices as well. In one embodiment, the wafer 132 may include Ge, SiGe, Si, although Si is preferred for compatibility with CMOS processing. The buffer stack 134 may include Ge, III-V materials, such as GaAs, MP or other materials may also be employed. In a particularly useful embodiment, the p-doped layer 136 may include a p-doped InGaAs layer although other III-V materials may be employed. In one embodiment, the wafer 132 includes Si, a first buffer layer 140 includes Ge, a second buffer layer 142 includes GaAs, a third buffer layer 144 includes InP and the p-doped layer 136 includes InGaAs, and in particular In$_{0.53}$Ga$_{0.47}$As. The buffer layers 140, 142, 144 provide lattice matching between the wafer 132 and the p-doped layer 136.

In accordance with useful embodiments, a II-VI material may be employed for n-type layer 138. In particular, ZnO or indium tin oxide (ITO) may be employed. The ZnO preferably includes ZnO:Al deposited by any suitable process, e.g., chemical vapor deposition (CVD), physical vapor deposition (PVT), atomic layer deposition (ALD), although other formation processes may be employed, e.g., metalorganic CVD (MOCVD), epitaxy, etc. The formation process forms the layer 138 to provide less surface damage to underlying layers including layer 136.

The carrier concentration (electron density) of the layer 146 may be between about $1\times10^{21}$ cm$^{-3}$ to about $5\times10^{21}$ cm$^{-3}$, and preferably about $3.0\times10^{21}$ cm$^{-3}$ for doped Aluminum Zinc Oxide (ZnO:Al) (AZO). The layer 138 may include a thickness of between about 5 nm and 50 nm, with a thickness of about 30 nm being preferred.

The use of AZO for layer 138 on the p-doped layer 136 reduces diode leakage by a significant amount, even on a high defect density p-doped layer 136, N-type layer 146 may be n-doped with, e.g., In, Ga, Al dopants.

The n-type material 138 (e.g., ZnO:Al) is preferably crystalline in form. This includes a monocrystalline structure and may include a multi-crystal structure or other crystalline structure (micro, nano, etc.). However, the AZO material of layer 138 may also include amorphous phases. In one embodiment, the ZnO of layer 20 is amorphous. The underlying layers, e.g., p-doped layer 136, layers 132, 140, 142, 144 are also preferably crystalline, but may include other phases.

A contact 150 is formed on layer 138. The contact 150 may include a wider range of materials over conventional devices due to the use of materials in layer 138. For example, the diode 130 may include metal contacts in a bi-layer structure (e.g., layers 152 and 154) which may include, e.g., Al and Au, respectively. An Al liner may be placed on the layer 138 followed by a highly conductive material such as Au or Pt. Other metals or combinations of metals are also contemplated. The Al of contact 138 may be employed to dope ZnO. The Al can increase the doping in AZO by annealing.

In accordance with the present principles, the effect of dislocation defects in semiconductor junctions may be reduced by employing a II-VI material instead of a material for an n-doped layer. As described in FIG. 2, a reduction in leakage current of 2 or more orders of magnitude can be achieved. The present principles enable the use of III-V materials on Si despite dislocation defects while at least maintaining or improving performance. The use of, e.g., AZO, to form a device tolerant of dislocation defects may be extended to any junction device. The present principles have been illustratively described in terms of transistors and diodes, but are applicable to any device including photodetectors, lasers, solar cells, etc. In addition, AZO may be substituted in device fabrication processes to overcome high density defects that may have been produced in earlier processing steps.

In accordance with the present principles, a Si substrate may be employed with InGaAs materials despite an 8% lattice mismatch by employing AZO n-type layers for S/D regions (for FETs) or for n-type layers for diodes. The AZO layer or equivalent material reduces the leakage current due to dislocation defects enough to permit improved performance despite the mismatch. This permits the use of Si substrates with III-V active layers without all the drawbacks of lattice mismatches.

Figure 5:
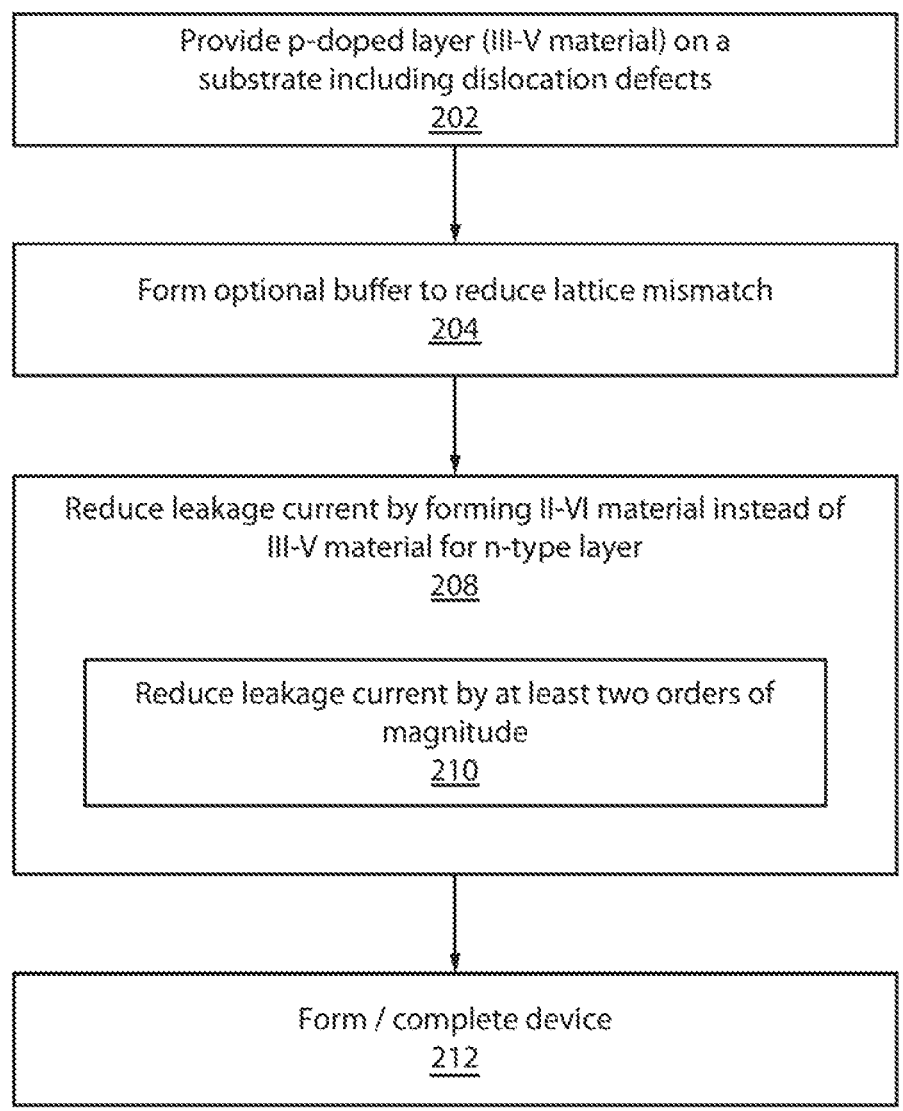
FIG. 5 is a block/flow diagram showing methods for forming a semiconductor device in accordance with illustrative embodiments.

Referring to FIG. 5, a method for forming a semiconductor device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a p-doped layer including, a doped III-V material is formed on/over a Si substrate wherein lattice mismatch between the material and the Si substrate provides a dislocation density exceeding $10^8$ cm$^{-2}$.

In block 204, an optional buffer layer may be formed between the substrate and the p-doped layer. The buffer layer or stack may include at least one layer configured to lattice match adjacent layers. The buffer layer ma be employed to reduce dislocation defects present by providing better lattice matching between adjacent layers.

In block 208, leakage current is reduced in the device by forming an n-type layer including a II-VI material (e.g., ZnO, ITO, ZnS, etc.) on or in the p-doped layer such that the device can tolerate the dislocation density to form an electronic device where the leakage current is less than that of a device with a III-V n-type layer. This effectively shuts down defect induced leakage. While the buffer layer, if employed, assists in reducing lattice mismatch, the II-VI material (ZnO) provides a high tolerance for dislocation defects. The ZnO addresses all dislocation defects and can handle dislocation densities exceeding, $10^8$ cm$^{-2}$, e.g., from III-V/Si interfaces, III-V/Ge interfaces, etc. III-V materials may include, e.g., InP, InAs, AlAs, AlN, GaN, InN, AlP, GaP, InP, AlAs, GaAs, InAs, etc. or tertiary compounds, e.g., InGaAs, AlGaAs, etc.

In block 210, reducing leakage current includes reducing leakage current at least two orders of magnitude for II-VI n-type layer over a III-V n-type layer. In block 212, a device is formed. For example, the n-type layer may be employed to form source and drain regions for a field effect transistor, a diode junction, etc. Further processing may include forming a gate structure, metallizations, etc.

Having described preferred embodiments for reduction of defect induced leakage in III-V semiconductor devices (which are intended to be illustrative and not limning), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming a p-doped layer including a doped III-V material on a Si substrate wherein lattice mismatch between the III-V material and the Si substrate provides a dislocation density exceeding $10^8$ cm$^{-2}$; and
   reducing leakage current in the device by forming an n-type layer including ZnO on or in the p-doped layer such that the n-type layer can tolerate the dislocation density.

2. The method as recited in claim 1, further comprising forming a buffer layer between the substrate and the p-doped layer, the buffer layer including at least one layer configured to lattice match adjacent layers.

3. The method as recited in claim 2, wherein the buffer layer includes at least one of Ge, a III-V material, GaAs, InP, or combination thereof.

4. The method as recited in claim 1, wherein the n-type layer includes a carrier concentration of between about $1\times10^{21}$ cm$^{-3}$ to about $5\times10^{21}$ cm$^{-3}$.

5. The method as recited in claim 1, wherein the n-type layer includes an amorphous phase.

6. The method as recited in claim 1, wherein the n-type layer forms source and drain regions for a field effect transistor.

7. The method as recited in claim 1, wherein the n-type layer forms a diode junction.

8. The method as recited in claim 1, wherein the electronic device includes an on/off ratio of greater than $1\times10^{3}$.

9. The method as recited in claim 1, wherein the reduced leakage current is reduced by at least two orders of magnitude.

10. A method for forming a semiconductor device, comprising:
    forming a p-doped layer including a doped III-V material on a Si substrate wherein lattice mismatch between the III-V material and the Si substrate provides a dislocation density; and
    reducing leakage current by at least two orders of magnitude in the semiconductor device by forming an n-type layer including ZnO on or in the p-doped layer such that the semiconductor device can tolerate the dislocation density.

11. The method as recited in claim 10, further comprising forming a buffer layer between the substrate and the p-doped layer, the buffer layer including at least one layer configured to lattice match adjacent layers.

12. The method as recited in claim 10, wherein the n-type layer forms one of source and drain regions for the field effect transistor.

13. The method as recited in claim 10, further comprising forming an electronic device where the leakage current is less than that of a device with a III-V n-type layer.

14. The method as recited in claim 13, wherein the electronic device includes an on/off ratio of greater than $1\times10^{3}$.

15. The method as recited in claim 10 wherein the dislocation density exceeds $10^{8}$ cm$^{-2}$.

16. The method as recited in claim 10, wherein the n-type layer includes an amorphous phase.

17. The method as recited in claim 10, wherein the n-type layer forms source and drain regions for a field effect transistor.

* * * * *